United States Patent [19]

Goser

[11] 4,035,782

[45] July 12, 1977

[54] CHARGE COUPLED DEVICE CIRCUIT FOR USE WITH A SEMICONDUCTOR STORAGE UNIT OR A SEMICONDUCTOR LOGICAL UNIT

[75] Inventor: Karl Goser, Munich, Germany

[73] Assignee: Siemens Aktiengesellschaft, Berlin & Munich, Germany

[21] Appl. No.: 590,275

[22] Filed: June 25, 1975
(Under 37 CFR 1.47)

[30] Foreign Application Priority Data

June 27, 1974 Germany ............ 2430947

[51] Int. Cl.² .................. G11C 11/44
[52] U.S. Cl. ............ 340/173 CA; 340/173 FF; 357/24
[58] Field of Search ......... 340/173 FF, 173 PP, 340/173 CA; 357/24

[56] References Cited

U.S. PATENT DOCUMENTS 3,792,322  2/1974  Boyle et al. ............. 357/24

OTHER PUBLICATIONS

*Testing L.S.I. Memory Arrays Using On-Chip I/O Shift Register Latches*, Balasubramanian et al., Dec. 1974, IBM Tech. Discl. Bull., vol. 17, No. 7, pp. 2019–2020.
*Non-Volatile CCD Memory With MNOS Storage Capacitors*, Goser et al., IEEE Journal of Solid State Circuits, vol. SC-9, No. 3, pp. 148–150, June 1974.

Primary Examiner—Marshall M. Curtis

Attorney, Agent, or Firm—Hill, Gross, Simpson, Van Santen, Steadman, Chiara & Simpson

[57] ABSTRACT

A charge coupled device circuit for use with a semiconductor Storage Unit or a semiconductor Logical Unit which includes at least a charge coupled device serially connected with a transistor between a supply voltage line and a reference potential (such as ground). The charge coupled device is located between the supply voltage line and the transistor. A further embodiment of the present invention includes, in addition to the above, a second transistor connected to form a flip-flop with the first transistor. A second charge coupled device is connected serially to the second transistor and in turn to the reference potential. The charge coupled device of this invention includes at least three control electrodes. A first electrode of each charge coupled device are connected to each other and to a first pulse line. A third electrode of each charge coupled device are connected to each other and to a second pulse line. The second electrode of the first charge coupled device is connected to the gate electrode of the second transistor and to a first selection transistor. The second electrode of the second charge coupled device is connected to the gate electrode of the first transistor and to a second selection transistor. The transistors referred to are field effect transistors having source, drain and gate electrodes.

Another embodiment of the invention includes a storage capacitor connected between the midpoint of the serially connected charge coupled device and its associated transistor and ground.

5 Claims, 4 Drawing Figures

CHARGE COUPLED DEVICE CIRCUIT FOR USE WITH A SEMICONDUCTOR STORAGE UNIT OR A SEMICONDUCTOR LOGICAL UNIT

BRIEF SUMMARY OF THE INVENTIN

The operating manner of charge coupled devices is basically known ("Electronics", May, 1970, Page 112; "Bell System Technical Journal", 1970, page 587 and 593 ) This operating manner will be explained in more detail in the following paragraph by way of will be explained in more detail in the following paragraph by way of FIG. 1.

Several control electrods 2, 3 and 4 are provided on an n-conducting semiconductor substrate 1. An insulating layer 5 is disposed between the semiconductor substrate 1 and the control electrodes 2, 3 and 4, which are deposited, for example, by vaporization. If silicon is used for the semiconductor substrate 1, the insulating layer 5 then preferably is in the form of silicon dioxide. Large variable voltages are applied to the control electrodes.

If different voltages are applied to two adjacent control electrodes, potential wells of varying depths develop in the semiconductor substrate 1. If these voltages are applied one after the other to electrodes arranged in a line, the potential wells shift along the semiconductor surface. Since the minority charge carriers, which were previously injected into the semiconductor substrate 1, for example, via a pn-junction always flow off into the lowest potential well, a transport of charges takes place corresponding to the traveling of the pontential wells along the surface of the semiconductor substrate 1.

In the case of the charge coupled device illustrated in FIG. 1, different large voltages are applied to the control electrodes 2 and 3, while the control electrode 4 is connected to ground. If now a greater negative voltage is applied to control electrode 3 than to control electrode 2, the potential well below the control electrode 3 penetrates deeper into the semiconductor substrate 1. This is shown in FIG. 1 by a dash-dot line 6. Due to this, positive charge carriers flow from the zone located below the control electrode 2 into the zone of the semiconductor substrate 1 which is located below the control electrode 3. The voltage applied to control electrode 2 may be identified as a "storage voltage", while the voltage applied to control electrode 3 is designated as a "shift voltage". Correspondingly, the zone of the semiconductor substrate 1 provide below the control electrode 2 is designated a "storage-depletion zone", while the area of the semicondcutor substrate 1 provided below the control electrode 3 is called a "charge-coupled device-depletion zone". Finally, the zone above the dash-dot line 6, provided at the edge of the component illustrated in FIG. 1, is identified as the threshold value-depletion zone.

There is a problem with storage units or logical units, respectively, which are constructed as complete flip-flops in the so-called "dynamic technique" in that the stored data must be renewed at certain time intervals since the charge corresponding to these data begins to flow off over longer time intervals due to leakage currents. The compensation of this flow-off is made via load transistors used in conventional storage or logical unis, respectively (compare R. H. Crawford in "MOSFET in Circuit Design", McGraw-Hill, New York, 1967 pages 12 and 87 ).

Therefore, it is an object of the present invention to provide a semiconductor storage unit or a logical unit, respectively, whereby the electrical charge is fed only to those points of the unit where this charge is actually needed or recharging the stored information.

According to the invention, this objective is achieved by providing a charge coupled device between the supply voltage line and a transistor.

It is possible by means of the invention for an electrical charge to be fed, due to the feedback, only to those points in the unit or in the circuit, respectively, where the charge is needed for recharging the stored data. Thereby the power loss can be kept smaller than is the case with conventional circuits constructed in the "dynamic technique". Since the charge coupled devices require less than, for instance, load transistors with long channels lengths, charge coupled devices are, therefore, more applicable in integrated circuits of high packing densities.

BRIEF DESCRIPTION OF THE DRAWINGS

The invention will be explained in more detail by way of the drawings as follows.

DETAILED DESCRIPTION OF THE INVENTION

In the present invention, charge coupled devices are inserted in the load branch of storage units and logical units. The operating manner of such a storage unit constructed in a p-channel-MOS-technique will be further explained with reference to FIGS. 2 and 3.

Figure 1:
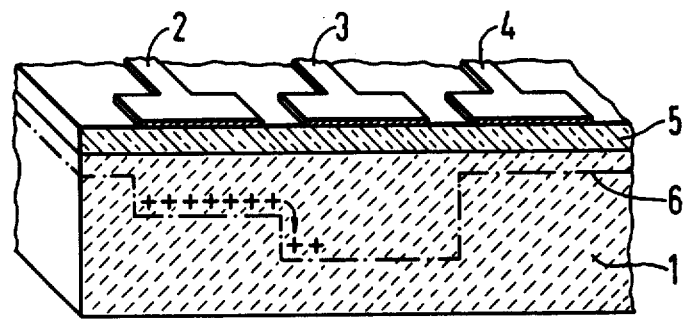
FIG. 1 shows a charge coupled device.
Figure 2:
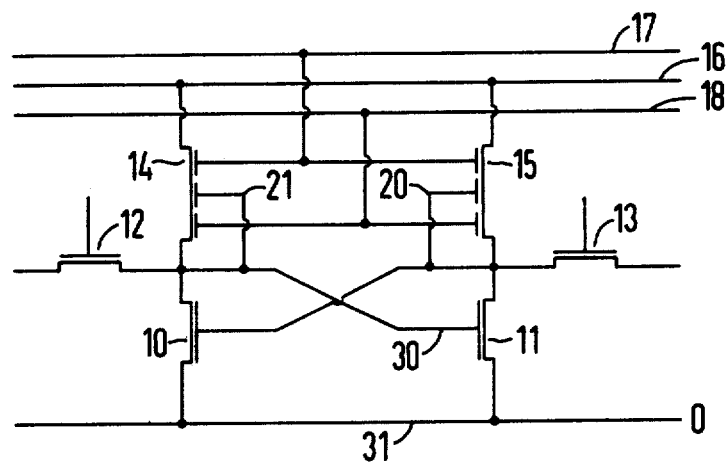
FIG. 2 shows a circuit of a storage unit according to the invention in a p-channel-MOS-Technique with charge coupled devices.

The circuit of FIG. 2 includes switching transistors 10 and 11, selection transistors 12 and 13, coupled devices 14 and 15, a supply voltage line 16 and lines 17 and 18. As the term "transistor" is used herein, it shall be deemed to refer to a field effect transistor". The switching transistors 10 and 11 form a bistable flip-flop so that one switching transistor is in the blocked state and the other one in the conducting state. The voltage at the drain region of the blocked switching transistor decreases without load elements due to unavoidable parasitic currents which flow, for example, as inverse currents at pn-junction. These currents carry off electrical charges from this point. This effect can, therefore, be compensated if an electric charge is supplied subsequently from the supply voltage line 16 to this nodal point. This means in the present case of a p-channel-MOS-Technique, that is, in the case of switching transistors 10 and 11 consisting of field effect transistors with a p-conducting channel, that a positive charge is fed from this nodal point to the supply voltage line 16 via the charge coupled components 14 and 15. For this, a high voltage is applied to the line 18 of such value that charge carriers flow from the nodal point in the potential well below the first storage electrode 18' (see FIG. 3).

A second storage electrode 20' (FIG. 3) is connected via a line 20 or 21, respectively, (FIG. 2) with the nodal points of the corresponding branch of the flip-flop and fulfills the following function: If, for example, the switching transistor 11 is blocked, the nodal point is at such a negative potential that a low potential well of such value develops below the second control electrode 20' (FIG. 3) that a portion of the charge carriers continues to flow from the zone below the first control electrode 18' to the zone below the second control electrode 20' in the n-conducting semiconductor substrate 1, if the voltage at the line 18 is switched off. This portion of the charge carriers is relatively small, since the voltage at the surface of the semiconductor substrate 1 below the second control electrode 20' is more positive than the voltage at the nodal point. Therefore, the charge carries flow into the zone below the second control electrode 20' mainly as a result of diffusion. If, on the contrary, the switching transistor 11 is in the conducting state, the nodal point is then applied with such a large positive potential that no potential well exists below the second control electrode 20'. Therefore, the greatest portion of the charge carriers below the first control electrode 18' returns to a p-conducting zone 25 which has been diffused in. A portion of the charge carriers recombines in the semiconductor substrate 1 which results in a relatively small current. It is thus achieved with the control electrode 20' that charges flow to the supply voltage line 16 only from the drain zone 25 of the blocked switching transistor 11. However, when switching transistor 11 is conducting, no charges flow from same to the supply voltage line 16 as long as a voltage pulse is applied to a third control electrode 17'.

Figure 3:
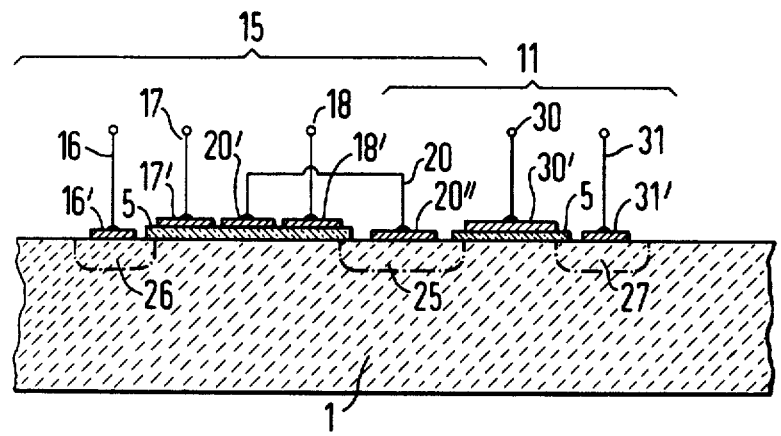
FIG. 3 shows a schematic cross section through a part of the storage unit with charge coupled devices according to the invention.

FIG. 3 represents a schematic cross sectional view of a part of a storage unit in accordance with the invention. P-conducting regions 25, 26 and 27 are provided in the n-conducting semiconductor substrate 1. Region 26 is contacted with an electrode 16' which in turn in is connected with the supply voltage line 16.

Region 25 is contacted with an electrode 20", which in turn is connected with the control electrode 20' via the line 20. Control electrodes 17', 18' and 20' are provided on an insulating layer 5 consisting of silicon dioxide between the electrodes 16' and 20". The regions 25 and 26, the electrodes 16', 20", and the control electrodes 17', 18' and 20' form the charge coupled device 15. Between the regions 25 and 27, an electrode 30' is provided on the insulating layer 5, which electrode is connected with the line 30. The regions 25 and 27, the electrode 20" and an electrode 31" disposed on region 27 and connected with a line 31 to be connected to ground, together with the electrode 30' form the switching transistor 11.

A great advantage of the storage unit according to the invention is that, due to the charge coupled components, a current flows only in the branch of the switching transistor 10 or 11, that is blocked, the mean value of this current additionally can be accurately adjusted by the successive frequency and amplitude of the voltage pulses applied to the lines 17 and 18. Therefore, the power loss of such a storage unit is very small as compared with the loss of a storage unit in a single channel-MOS-Technique, where tests have shown, a high power loss occurs due to the current-voltage characteristic line of the load transistors which proceeds in a square manner. The initially mentioned surface requirement can be still further reduced if the supply voltage line 16 is combined with line 17 or with line 18 so that in this case only line 17 or line 18 is needed as an additional line with respect to a storage unit in the static technique.

Figure 4:
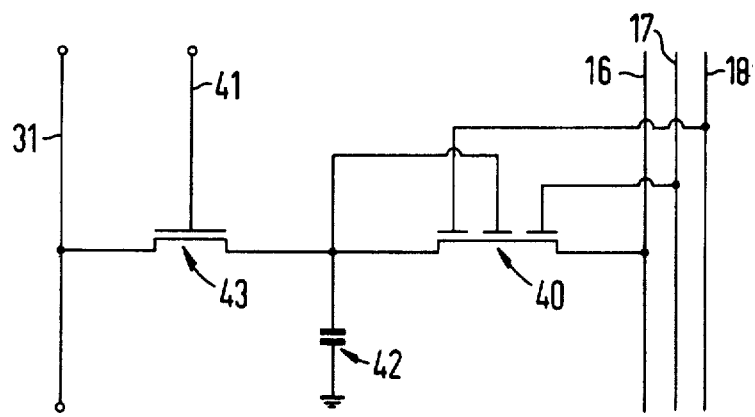
FIG. 4 shows a further embodiment of the invention.

FIG. 4 shows a further embodiment of the invention, whereby a charge coupled component 40 is disposed between the supply voltage line 16 and a storage capacitor 42 or a selection transistor 43, respectively. The storage capacitor 42 is connected to ground on one side. The selection transistor 43 is connected also with the line 31 applied to a reference potential and is activated via a line 41. On account of this, the charge is pumped from the storage capacitor 42 which corresponds to the voltage applied to the storage capacitor 42.

Charge coupled components instead of load transistors may be incorporated advantageously according to the invention in logical units as well, in the same fashion as in storage units.

It will be apparent to those skilled in the art that many modifications and variations may be effected without departing from the spirit and scope of the novel concepts of the present invention.

I claim as my invention:

1. A logic circuit comprising:
   a voltage supply line;
   a reference line;
   first and second voltage pulse lines for receiving respective voltage pulse trains whose pulses are of predetermined amplitude; and
   a storage element and a load element connected in series between said supply and reference lines,
   said storage element including a zone which is subject of charge leakage in a predetermined logic state which effects a potential at said zone which varies as a function of the charge leaked, and a first conduction electrode carried on said zone;
   said load element comprising a charge device including a substrate, a second conduction electrode connected to said supply line and first, second and third aligned control electrodes, said first and third control electrodes connected to said first and second voltage pulse lines, respectively, and said second control electrode connected to said first conduction electrode whereby the portion of charge flow between the substrate regions corresponding to said second and third control electrodes compensates charge lost through leakage.

2. A logic circuit according to claim 1, wherein said storage element comprises a FET transistor including a drain-source circuit connected in series with said charge coupled device.

3. A logic circuit according to claim 1, wherein said storage element comprises a MOS capacitor connected in series with said charge coupled device.

4. A logic circuit according to claim 1, wherein said supply line and one of said voltage pulse lines are connected in common.

5. A logic circuit comprising:
   a voltage supply line; and first and second voltage pulse lines for receiving respective voltage pulse trains whose pulses have a predetermined amplitude; and
   a flip-flop circuit including a pair of branches, each of said branches comprising
   a field effect transistor having a source-drain circuit and including a zone which is subject to charge loss in the blocked state of the transistor effecting a potential at said zone which varies as a function of charge loss, and a first conduction electrode carried on said zone, and a charge coupled device connected in series with said field effect transistor between said supply line and said reference line, said charge coupled device including a substrate which is also common to said transistor, a second conduction electrode connected to said supply line, and first, second and third control electrodes carried aligned over and insulated from said substrate, said first and third control electrodes connected to said first and second voltage pulse lines, respectively, and said second control electrode connected to said first conduction electrode whereby the portion of charge flow between substrate regions corresponding to said and third control electrodes compensates the charge loss.

* * * * *